United States Patent
Jia et al.

(10) Patent No.: US 12,336,372 B2
(45) Date of Patent: Jun. 17, 2025

(54) ORGANIC LIGHT-EMITTING DIODE, METHOD OF MANUFACTURING THE SAME AND ORGANIC LIGHT-EMITTING DIODE DISPLAY APPARATUS

(71) Applicant: BOE TECHNOLOGY GROUP CO., LTD., Beijing (CN)

(72) Inventors: Congcong Jia, Beijing (CN); Lei Chen, Beijing (CN); Kun Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 17/768,265

(22) PCT Filed: May 21, 2021

(86) PCT No.: PCT/CN2021/095150
§ 371 (c)(1),
(2) Date: Apr. 12, 2022

(87) PCT Pub. No.: WO2021/249160
PCT Pub. Date: Dec. 16, 2021

(65) Prior Publication Data
US 2024/0138180 A1 Apr. 25, 2024
US 2024/0237390 A9 Jul. 11, 2024

(30) Foreign Application Priority Data
Jun. 10, 2020 (CN) .......................... 202010524270.8

(51) Int. Cl.
*H10K 50/18* (2023.01)
*C09K 11/02* (2006.01)
(Continued)

(52) U.S. Cl.
CPC ............ *H10K 50/181* (2023.02); *C09K 11/02* (2013.01); *C09K 11/06* (2013.01); *H10K 50/17* (2023.02);
(Continued)

(58) Field of Classification Search
None
See application file for complete search history.

(56) References Cited

U.S. PATENT DOCUMENTS

2014/0295603 A1* 10/2014 Kakiuchi ............... H10K 50/11
438/46
2018/0337360 A1* 11/2018 Huang ................... H10K 71/00
(Continued)

FOREIGN PATENT DOCUMENTS

| CN | 102916131 A | 2/2013 |
| CN | 104934544 A | 9/2015 |

(Continued)

OTHER PUBLICATIONS

China Patent Office, CN202010524270.8 First Office Action issued on Dec. 28, 2021.
(Continued)

*Primary Examiner* — Nishath Yasmeen
(74) *Attorney, Agent, or Firm* — HOUTTEMAN LAW LLC

(57) ABSTRACT

The present disclosure provides an organic light-emitting diode, a method of manufacturing the same, and an organic light-emitting diode display apparatus. The organic light-emitting diode includes an anode; a hole injection layer; a hole transport layer; an electron blocking layer; an organic luminescent layer; a hole blocking layer; an electron transport layer; and a cathode, wherein a first composite layer is provided between the electron blocking layer and the organic luminescent layer, and the first composite layer
(Continued)

includes a material of the electron blocking layer and a host material of the organic luminescent layer.

18 Claims, 6 Drawing Sheets

(51) Int. Cl.
  *C09K 11/06* (2006.01)
  *H10K 50/17* (2023.01)
  *H10K 71/12* (2023.01)
  *H10K 85/10* (2023.01)
  *H10K 85/30* (2023.01)
  *H10K 85/60* (2023.01)
  *H10K 102/00* (2023.01)

(52) U.S. Cl.
  CPC ........... *H10K 71/12* (2023.02); *H10K 85/111* (2023.02); *H10K 85/311* (2023.02); *H10K 85/324* (2023.02); *H10K 85/60* (2023.02); *H10K 85/615* (2023.02); *H10K 85/631* (2023.02); *H10K 85/654* (2023.02); *H10K 85/6572* (2023.02); *C09K 2211/1011* (2013.01); *H10K 2102/351* (2023.02)

(56) References Cited

U.S. PATENT DOCUMENTS

2019/0081212 A1 3/2019 Nagata
2019/0115551 A1* 4/2019 Jiao ................. H10K 30/865

FOREIGN PATENT DOCUMENTS

| CN | 107195791 A | 9/2017 |
| CN | 108448003 A | 8/2018 |
| CN | 108832008 A | 11/2018 |
| CN | 109585668 A | 4/2019 |
| CN | 111048675 A | 4/2020 |
| CN | 111628096 A | 9/2020 |

OTHER PUBLICATIONS

China Patent Office, CN202010524270.8 Second Office Action issued on Jun. 29, 2022.

* cited by examiner

ORGANIC LIGHT-EMITTING DIODE, METHOD OF MANUFACTURING THE SAME AND ORGANIC LIGHT-EMITTING DIODE DISPLAY APPARATUS

TECHNICAL FIELD

The present application relates to the field of display technology, and more particularly, relates to an organic light-emitting diode, a method of manufacturing the same and an organic light-emitting diode display apparatus.

BACKGROUND

Organic light-emitting diodes (OLEDs) are self-luminous, consume less power, have bright colors and wide viewing angles, and are capable of forming flexible products. For these advantages, they are gradually replacing liquid crystal displays (LCDs) to become mainstream products. OLED devices are red, green and blue (RGB) light-emitting devices individually prepared by organic materials, which are combined to emit white light.

SUMMARY

The present disclosure provides an organic light-emitting diode, including an anode; a hole injection layer including a hole injection material; a hole transport layer; an electron blocking layer; an organic luminescent layer including a host material and a dopant material; a hole blocking layer; an electron transport layer; and a cathode, wherein a first composite layer is provided between the electron blocking layer and the organic luminescent layer, and the first composite layer includes a material of the electron blocking layer and the host material of the organic luminescent layer.

In one embodiment, the material of the electron blocking layer includes a spirofluorene-based material or an aromatic amine-based material, and the host material of the organic luminescent layer includes a naphthalene-based compound.

In one embodiment, a mass ratio of the material of the electron blocking layer to the host material of the organic luminescent layer ranges from around 2:8 to around 8:2.

In one embodiment, a thickness of the first composite layer ranges from around 1 nm to around 3 nm.

In one embodiment, a second composite layer is provided between the hole transport layer and the electron blocking layer, and the second composite layer includes the material of the electron blocking layer and the hole injection material.

In one embodiment, the material of the electron blocking layer includes a spirofluorene-based material or an aromatic amine-based material, and the hole injection material includes 2,3,5,6-tetrafluoro-7,7,8,8-tetracyanoquinodimethane, copper(II) phthalocyanine, polyaniline, or 4,4',4"-tris (N-3-methylphenyl-N-phenylamino) triphenylamine.

In one embodiment, a mass percentage of the hole injection material in the second composite layer ranges from around 4% to around 10%.

In one embodiment, a thickness of the second composite layer is between around 1 nm and around 3 nm.

In one embodiment, the electron transport layer includes a first material including a quinoxaline or imidazole-based compound and a second material including aluminum octa-hydroxyquinoline; a thickness of the electron transport layer ranges from around 20 nm to around 40 nm; and a mass ratio of the first material to the second material ranges from around 4:6 to around 6:4.

In one embodiment, the dopant material is a fluorene-based compound; and a mass percentage of the dopant material in the organic luminescent layer ranges from around 1% to around 5%.

In one embodiment, the hole transport layer includes an aromatic triamine-based compound; and a thickness of the hole transport layer ranges from around 80 nm to around 130 nm.

The present disclosure further provides a method of manufacturing an organic light-emitting diode, including: forming an anode; forming a hole injection layer such that the hole injection layer includes a hole injection material; forming a hole transport layer; forming an electron blocking layer; forming a first composite layer; forming an organic luminescent layer such that the organic luminescent layer includes a host material and a dopant material; forming a hole blocking layer; forming an electron transport layer; and forming a cathode, wherein the first composite layer includes a material of the electron blocking layer and the host material of the organic luminescent layer.

In one embodiment, the forming the first composite layer includes simultaneously evaporating the material of the electron blocking layer and the host material of the organic luminescent layer on the electron blocking layer.

In one embodiment, after the forming the hole transport layer and before the forming the electron blocking layer, the method further includes forming a second composite layer on the hole transport layer such that the second composite layer includes the material of the electron blocking layer and the hole injection material.

In one embodiment, the forming the second composite layer on the hole transport layer includes simultaneously evaporating the material of the electron blocking layer and the hole injection material on the hole transport layer.

In one embodiment, the electron transport layer includes a first material including a quinoxaline or imidazole-based compound and a second material including aluminum octa-hydroxyquinoline; and the forming the electron transport layer includes simultaneously evaporating the first material and the second material on the hole blocking layer.

The present disclosure further provides an organic light-emitting diode display apparatus, including the above-mentioned organic light-emitting diode.

BRIEF DESCRIPTION OF THE DRAWINGS

The present disclosure will become more apparent to a person skilled in the art by describing in detail embodiments of the present disclosure with reference to the accompanying drawings, in which.

DETAILED DESCRIPTION OF EMBODIMENTS

To enable a person skilled in the art to better understand the technical solutions of the present disclosure, a detailed description is hereinafter given to the organic light-emitting diode (OLED), the method of manufacturing the same and the organic light-emitting diode display apparatus provided in the present disclosure with reference to the accompanying drawings and embodiments.

At present, the lifetime of a blue OLED device is relatively short, and as a result, the overall lifetime of an OLED display product is relatively short. This limits the application of the OLED display product having the OLED device.

Figure 1:
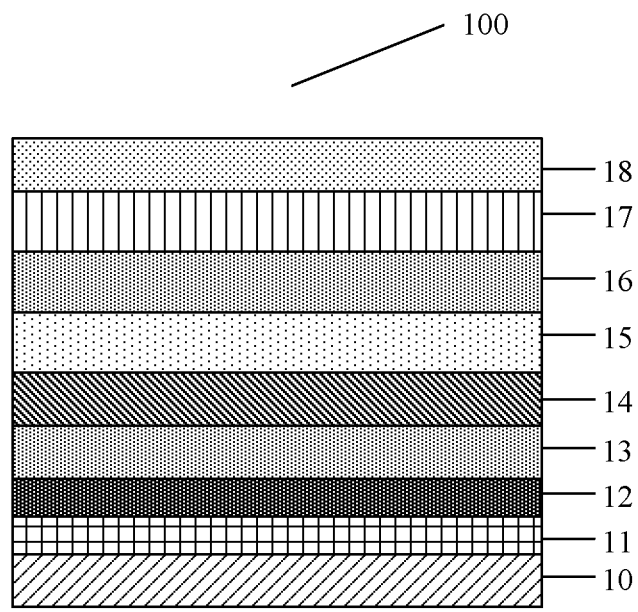
FIG. 1 is a schematic view of a structure of an organic light-emitting diode in the related art.

FIG. 1 illustrates a schematic view of a structure of an organic light-emitting diode in the related art. Typically, an organic light-emitting diode (OLED) 100 includes an anode 10, a hole injection layer 11, a hole transport layer 12, an electron blocking layer 13, an organic luminescent layer 14, a hole blocking layer 15, an electron transport layer 16, an electron injection layer 17 and a cathode 18 that are formed one after another. The organic luminescent layer 14 made of a specific material will cause a corresponding OLED to emit light of a specific color, thereby obtaining an OLED with a specific color, such as a red OLED, a green OLED and a blue OLED, and these three OLEDs can realize three primary colors. Of these OLEDs, the lifetime of the blue OLED is relatively short. Therefore, much attention has been drawn to the issue of extending the lifetime of the blue OLED in order to extend the lifetime of the OLED display product.

Figure 2:
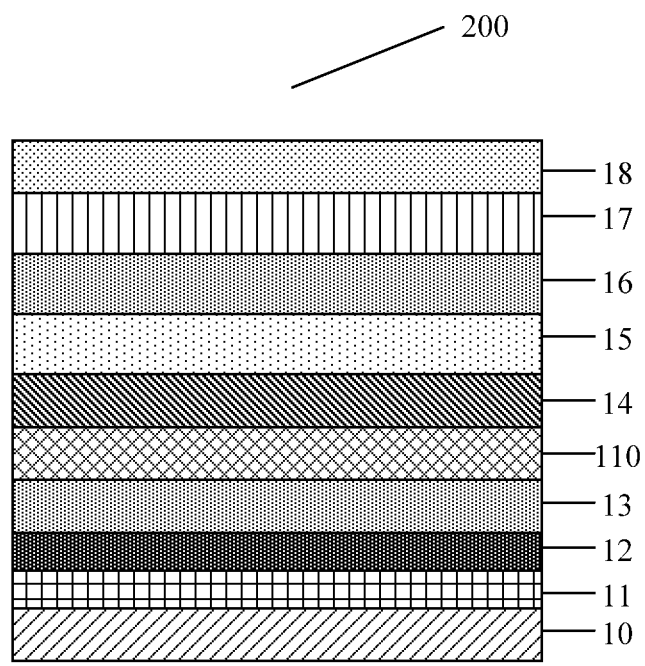
FIG. 2 is a schematic view of a structure of an organic light-emitting diode according to some embodiments of the present disclosure.

FIG. 2 illustrates a schematic view of a structure of an organic light-emitting diode according to some embodiments of the present disclosure. Specifically, on the basis of the configuration of the OLED 100 as illustrated in FIG. 1, an OLED 200 further includes a first composite layer 110 additionally provided between the electron blocking layer 13 and the organic luminescent layer 14.

The first composite layer 110 includes a material of the electron blocking layer 13 and a host material of the organic luminescent layer 14; for example, the first composite layer may be formed by simultaneously evaporating respective materials of the electron blocking layer 13 and the organic luminescent layer 14 on the electron blocking layer 13. For example, in the first composite layer 110, the material of the electron blocking layer 13 includes a spirofluorene-based material or an aromatic amine-based material, and the host material of the organic luminescent layer 14 includes a naphthalene-based compound for a blue OLED. For example, in the first composite layer 110, a mass ratio of the material of the electron blocking layer 13 to the host material of the organic luminescent layer 14 ranges from 2:8 to 8:2. A thickness of the first composite layer 110, for example, is between 1 nm and 3 nm.

Other layers in the OLED 200 may be made of materials used in conventional techniques. For example, the hole injection layer 11 may be made of one material or a combination of multiple materials, which may be selected from 2,3,5,6-tetrafluoro-7,7,8,8-tetracyanoquinodimethane (F4TCNQ), copper(II) phthalocyanine, polyaniline, 4,4',4"-tris (N-3-methylphenyl-N-phenylamino) triphenylamine (TDATA) and the like; and a thickness of the hole injection layer 11 may be between 2 nm to 20 nm. A material of the hole transport layer 12, for example, is an aromatic triamine-based compound, such as triphenylamine (TPA), tetraphenylbenzidine (TPB) or the like, and this type of material has a relatively high hole mobility; and a thickness of the hole transport layer 12 may be between 80 nm to 130 nm. The material of the electron blocking layer 13 is the spirofluorene-based material or aromatic amine-based material, and such material also has a relatively high hole mobility, but this hole mobility is lower than that of the material of the hole transport layer; and a thickness of the electron blocking layer 13 may be between 3 nm to 10 nm. The organic luminescent layer 14 includes the host material (e.g., the naphthalene-based compound) and a dopant material (a fluorene-based compound); a thickness of the organic luminescent layer 14 may be between 15 nm to 30 nm; and a mass percentage of the dopant material in the organic luminescent layer 14, for example, is between 1% to 5%. A thickness of the hole blocking layer 15 may be controlled to be in a range from 3 nm to 10 nm. The electron transport layer 16 includes a first material including a quinoxaline or imidazole-based compound and a second material including aluminum octahydroxyquinoline; a thickness of the electron transport layer ranges from 20 nm to 40 nm; and a mass ratio of the first material to the second material ranges from 4:6 to 6:4. The cathode 18 may be formed by evaporating magnesium and silver simultaneously, and a mass ratio of magnesium to silver is controlled in a range from 1:9 to 9:1. The formed OLED device may be encapsulated with UV glass.

In the OLED 200 of the present disclosure, an interface between the electron blocking layer and the organic luminescent layer is eliminated by co-evaporating the material of the electron blocking layer and the host material of the organic luminescent layer there-between, which eliminates the accumulation of charges at the interface and slows down the degradation of the material caused by the charges, thereby extending the lifetime of the OLED device. Among the OLED devices, the blue OLED device has the shortest lifetime, and therefore, extending its lifetime is of great significance to extending the overall lifetime of the OLED product.

Figure 3:
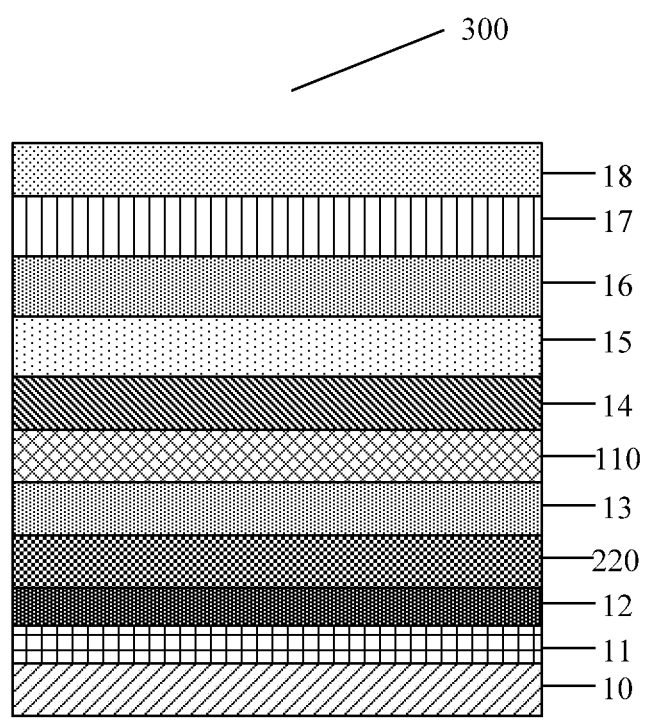
FIG. 3 is a schematic view of a structure of an organic light-emitting diode according to some embodiments of the present disclosure.

FIG. 3 is a schematic view of a structure of an organic light-emitting diode according to some embodiments of the present disclosure. Specifically, on the basis of the configuration of the OLED 200 as illustrated in FIG. 2, an OLED 300 further includes a second composite layer 220 additionally provided between the electron blocking layer 13 and the hole transport layer 12.

The second composite layer 220 includes a material of the electron blocking layer 13 and a material of the hole injection layer 11. The material of the electron blocking layer 13 includes a spirofluorene-based material or an aromatic amine-based material, and the material of the hole injection layer 11 includes 2,3,5,6-tetrafluoro-7,7,8,8-tetracyanoquinodimethane, copper(II) phthalocyanine, polyaniline, or 4,4',4"-tris (N-3-methylphenyl-N-phenylamino) triphenylamine. A mass percentage of the material of the hole injection layer 11 in the second composite layer 220 ranges from 4% to 10%. A thickness of the second composite layer 220 is between 1 nm to 3 nm.

Materials and thicknesses of other layers in the OLED 300 can be referred to the foregoing description regarding the OLED 200, and will not be repeated herein.

In the foregoing embodiments of the present disclosure, an interface between the hole transport layer and the electron blocking layer is further eliminated by simultaneously evaporating the material of the electron blocking layer and the material of the hole injection layer on the hole transport layer, and the interface between the electron blocking layer and the organic luminescent layer is eliminated by co-evaporating the material of the electron blocking layer and the host material of the organic luminescent layer. Both of the above measures can improve injection and transportation of holes between two adjacent functional layers and alleviate the impact of the charges on the material, thereby slowing down the degradation of the organic material and greatly extending the lifetime of the OLED device.

Figure 4:
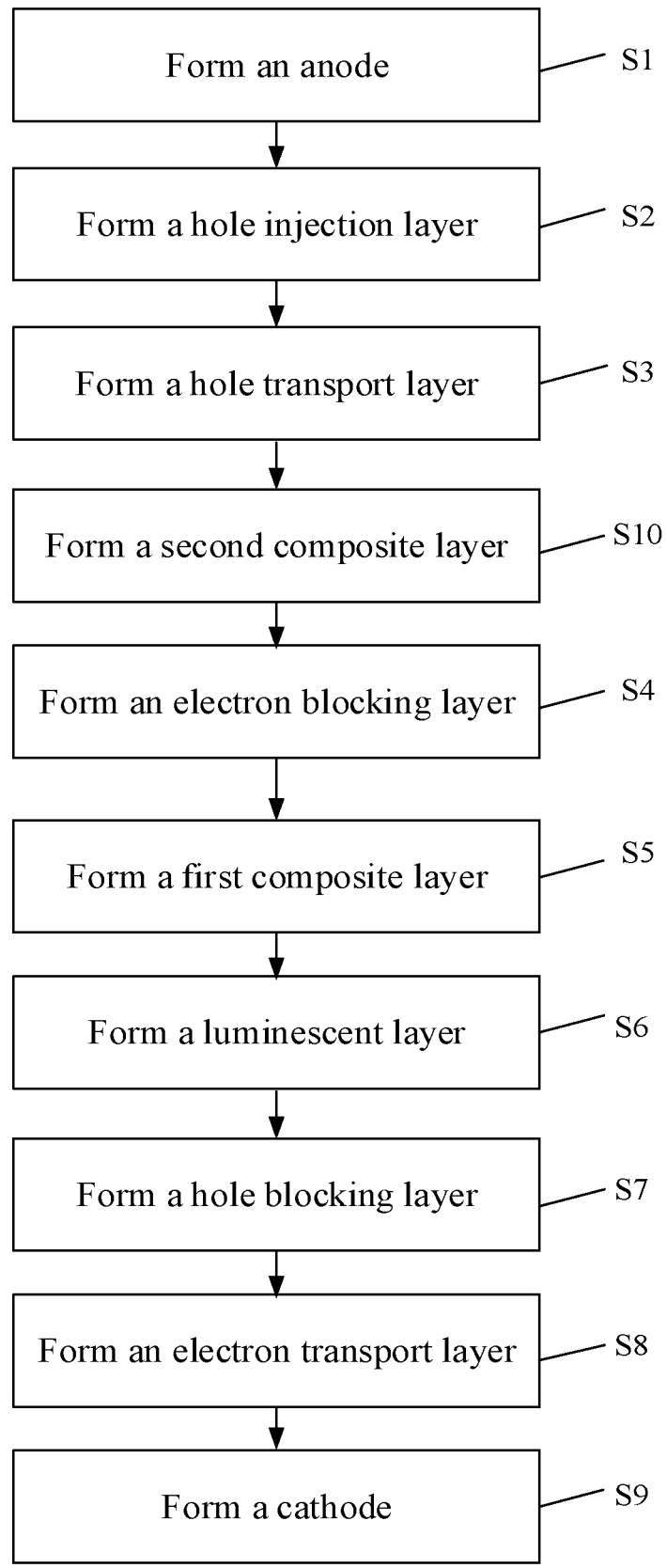
FIG. 4 is a flow chart of a method of manufacturing an organic light-emitting diode according to some embodiments of the present disclosure.

FIG. 4 is a flow chart of a method of manufacturing an organic light-emitting diode according to some embodiments of the present disclosure. Specifically, the method may include the following steps:

S1: Form an anode.

S2: Form a hole injection layer.

The hole injection layer is made of a hole injection material which may be one material or a combination of multiple materials, the hole injection material may be selected from 2,3,5,6-tetrafluoro-7,7,8,8-tetracyanoquinodimethane, copper(II) phthalocyanine, polyaniline, 4,4',4"-tris(N-3-methylphenyl-N-phenylamino) triphenylamine and the like, and the content of the hole injection material in the hole injection layer is less than 10%. A thickness of the hole injection layer may be controlled in a range from 2 nm to 20 nm.

S3: Form a hole transport layer.

A material of the hole transport layer may be an aromatic triamine-based compound, such as triphenylamine (TPA), tetraphenylbenzidine (TPB) or the like, and this type of material has a relatively high hole mobility. A thickness of the hole transport layer may be controlled in a range from 80 nm to 130 nm.

S4: Form an electron blocking layer.

A material of the electron blocking layer may include an aromatic amine-based material and the like, and a thickness of the electron blocking layer may be controlled in a range from 3 nm to 10 nm.

S5: Form a first composite layer such that the first composite layer includes the material of the electron blocking layer and a host material of an organic luminescent layer.

After the electron blocking layer has been formed, the material of the electron blocking layer and the host material of the organic luminescent layer are simultaneously evaporated on the electron blocking layer; the host material may be a naphthalene-based compound; a thickness of the first composite layer may be controlled in a range from 1 nm to 3 nm; and a ratio of the material of the electron blocking layer to the host material may be controlled in a range from 2:8 to 8:2.

S6: Form the organic luminescent layer.

The host material of the organic luminescent layer, as described above, is the naphthalene-based compound, and a dopant material of the organic luminescent layer is a fluorene-based compound. A thickness of the organic luminescent layer may be controlled in a range from 15 nm to 30 nm. A mass percentage of the dopant material in the organic luminescent layer may be controlled in a range from 1% to 5%.

S7: Form a hole blocking layer. A thickness of the hole blocking layer may be controlled in a range from 3 nm to 10 nm.

S8: Form an electron transport layer.

The forming the electron transport layer includes simultaneously evaporating a first material including a quinoxaline or imidazole-based compound and a second material including aluminum octahydroxyquinoline. A thickness of the electron transport layer ranges from 20 nm to 40 nm; and a ratio of the first material to the second material ranges from 4:6 to 6:4.

S9: Form a cathode.

The forming the cathode may include simultaneously evaporating magnesium and silver, and a ratio of the magnesium to the silver is controlled in a range from 1:9 to 9:1.

In order to form the OLED 300 illustrated in FIG. 3, the method further includes a step S10 between the steps S3 and S4. The step S10 is to form a second composite layer. The second composite layer includes the material of the electron blocking layer and the hole injection material. Specifically, the forming the second composite layer includes simultaneously evaporating the material of the electron blocking layer and the hole injection material on the hole transport layer. The material of the electron blocking layer may be an aromatic amine-based material or the like, and such material has a relatively high hole mobility, but this hole mobility is lower than that of the material of the hole transport layer. The content of the hole injection material in the second composite layer is higher than that in the hole injection layer, a doping amount of the hole injection material is controlled in a range from 4% to 10%, and a thickness of the second composite layer may be controlled in a range from 1 nm to 3 nm.

The OLED formed by the foregoing method may be encapsulated with glass by UV.

Figure 5A:
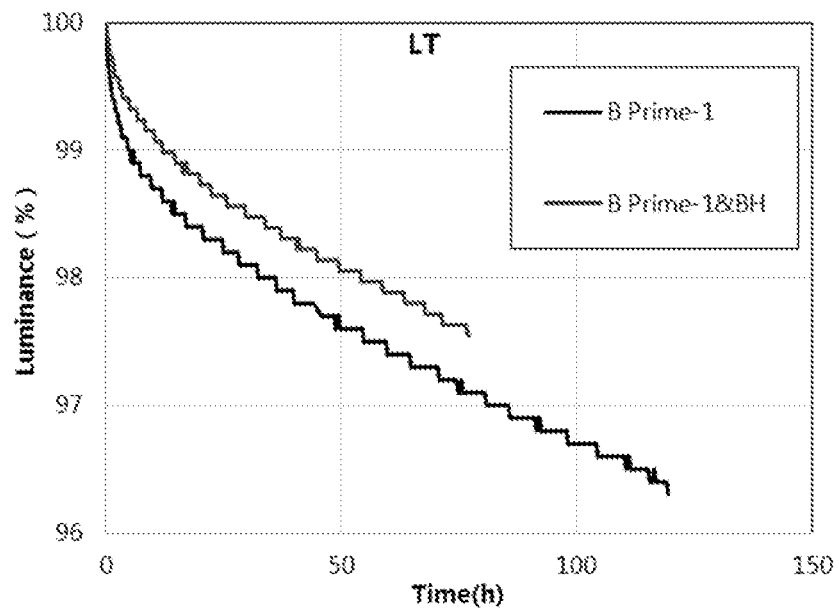
FIGS. 5(a) to 5(c) are graphs showing performance tests for an organic light-emitting diode according to some embodiments of the present disclosure.
Figure 5B:
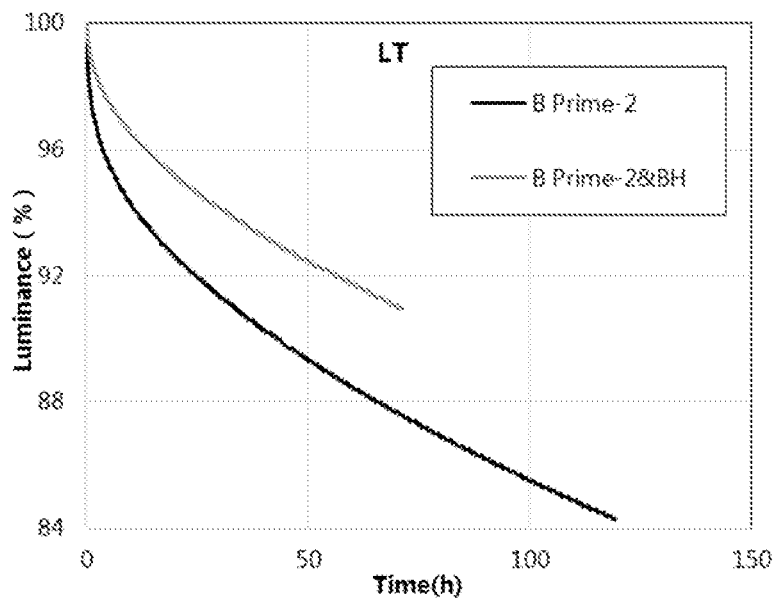
Figure 5C:
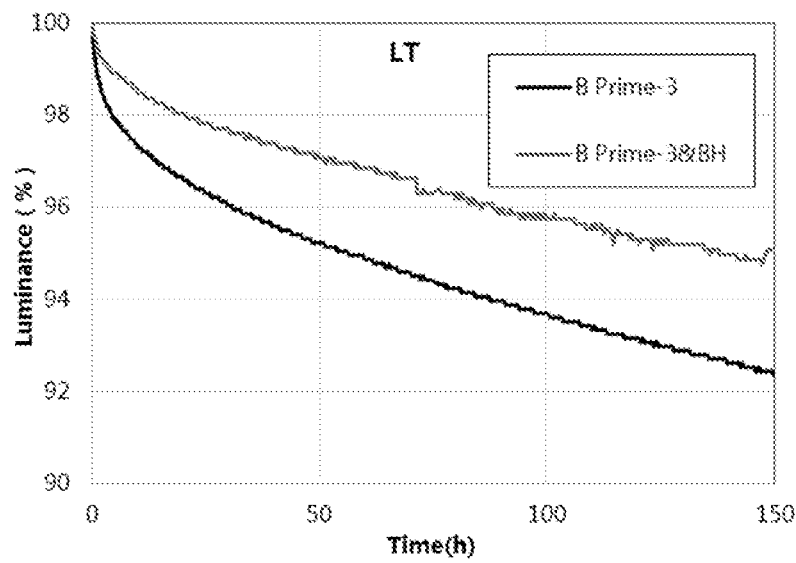

Three encapsulated OLEDs 100 and three encapsulated OLEDs 200 are put to comparative tests, respectively, and results of their optical characteristic parameters obtained from the three comparative tests are shown in Tables 1 to 3 below, and differences between lifetimes of the OLEDs 100 and OLEDs 200 obtained there-from are shown in FIGS. 5(a) to 5(c), respectively.

TABLE 1

|  | Volt(V) | Cd/A | CIE x | CIE y | LT(95%) |
|---|---|---|---|---|---|
| B Prime-1 | 100% | 100% | 0.1329 | 0.1419 | 100% |
| B Prime-1&BH | 100.8% | 96.4% | 0.1331 | 0.1405 | 109.4% |

TABLE 2

|  | Volt (V) | cd/A | CIEx | CIEy | LT(95%) |
|---|---|---|---|---|---|
| B Prime-2 | 100% | 100% | 0.1333 | 0.1397 | 100% |
| B Prime-2&BH | 101.7% | 99.2% | 0.1333 | 0.1392 | 305.9% |

TABLE 3

|  | Volt (V) | cd/A | CIEx | CIEy | LT(95%) |
|---|---|---|---|---|---|
| B Prime-3 | 100% | 100% | 0.1343 | 0.1398 | 100% |
| B Prime-3&BH | 100.8% | 96.6% | 0.1345 | 0.1379 | 250% |

In Tables 1 to 3 and FIGS. 5(a) to 5(c), B Prime-1, B Prime-2 and B Prime-3 represent three samples of the OLED 100 in the related art; and B Prime-1&BH, B Prime-2&BH and B Prime-3&BH represent three samples of the OLED 200 according to the present disclosure;

Volt (V) represents a voltage difference applied between two ends of an organic light-emitting diode;

Cd/A represents luminous flux per unit area;
CIEx represents a chromaticity coordinate;
CIEy represents another chromaticity coordinate; and
LT(95%) represents lifetime (when luminance is 95%).

The above comparisons show that compared to the OLED 100 in the related art, light efficiency of the OLED 200 according to the present disclosure slightly decreases, but the chromaticity coordinates thereof are basically unchanged, and the lifetime thereof is significantly extended. FIGS. 5(*a*) and 5(*c*) also show that when luminance is 95%, the OLED 200 according to the present disclosure has a longer lifetime.

Figure 6A:
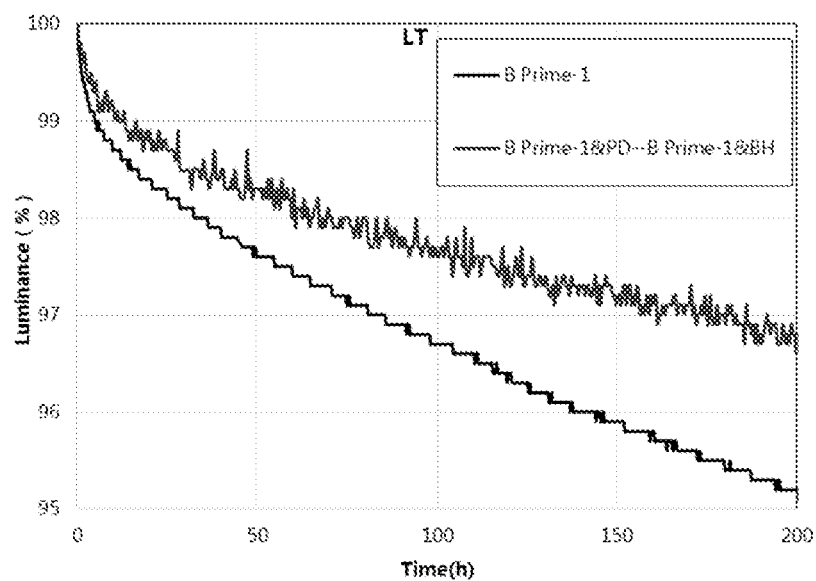
FIGS. 6(a) to 6(c) are graphs showing performance tests for an organic light-emitting diode according to some embodiments of the present disclosure.
Figure 6B:
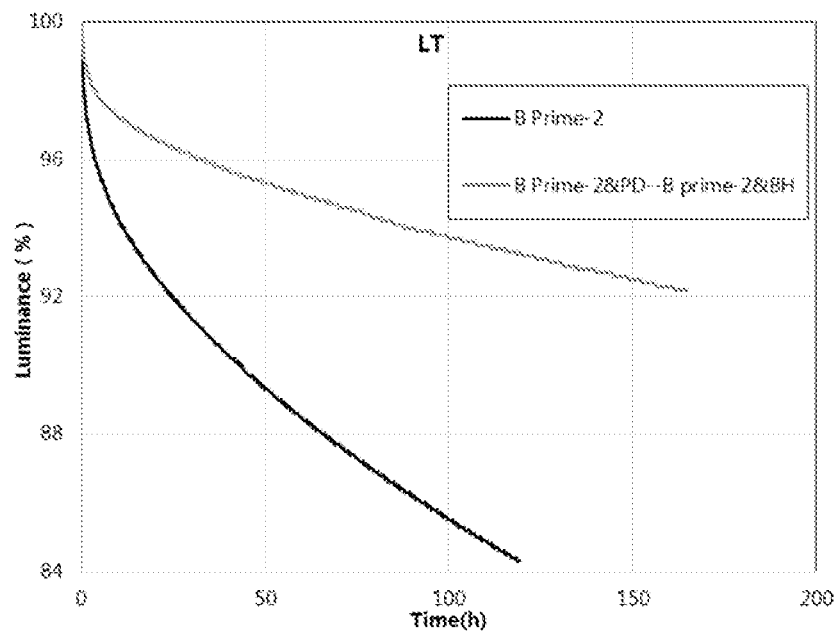
Figure 6C:
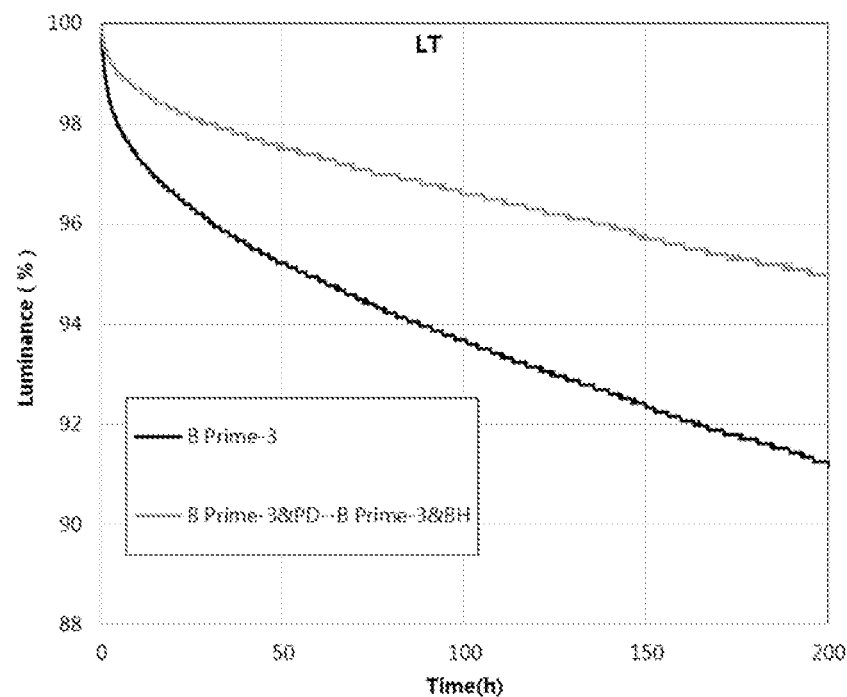

Three encapsulated OLEDs 100 and three encapsulated OLEDs 300 were divided into three groups for comparative tests, results of their optical characteristic parameters obtained from the three comparative tests are shown in Tables 4 to 6 below, and differences between lifetimes of the OLEDs 100 and the OLEDs 300 obtained there-from are shown in FIGS. 6(*a*) to 6(*c*), respectively.

TABLE 4

|  | Volt(V) | Cd/A | CIE x | CIE y | LT95 |
|---|---|---|---|---|---|
| B Prime-1 | 100% | 100% | 0.1329 | 0.1419 | 100% |
| B Prime-1&PD-B Prime-1&BH | 99.7% | 91.7% | 0.1334 | 0.1403 | 191.9% |

TABLE 5

|  | Volt (V) | cd/A | CIEx | CIEy | LT95 |
|---|---|---|---|---|---|
| B Prime-2 | 100% | 100% | 0.1333 | 0.1397 | 100% |
| B Prime-2&PD-B Prime-2&BH | 98.8% | 96.4% | 0.1335 | 0.1381 | 831.2% |

TABLE 6

|  | Volt (V) | cd/A | CIEx | CIEy | LT95 |
|---|---|---|---|---|---|
| B Prime-3 | 100% | 100% | 0.1333 | 0.1397 | 100% |
| B Prime-3&PD-B Prime-3&BH | 100% | 87.4% | 0.1335 | 0.1381 | 345.7% |

In Tables 4 to 6 and FIGS. 6 (*a*) to 6(*c*), B Prime-1, B Prime-2 and B Prime-3 represent three samples of the OLED 100 in the related art; and B Prime-1&PD-B Prime-1&BH, B Prime-2&PD-B Prime-2&BH and B Prime-3&PD-B Prime-3&BH represent three samples of the OLED 300 according to the present disclosure;
Volt (V) represents a voltage difference applied between two ends of an organic light-emitting diode;
Cd/A represents luminous flux per unit area;
CIEx represents a chromaticity coordinate; and
CIEy represents another chromaticity coordinate; and
LT95 represents lifetime (when luminance is 95%).

The above comparisons show that compared to the OLED 100 in the related art, light efficiency of the OLED 300 according to the present disclosure slightly decreases, but the chromaticity coordinates thereof are basically unchanged, and the lifetime thereof is significantly extended. FIGS. 6(*a*) and 6(*c*) also show that when luminance is 95%, the OLED 300 according to the present disclosure has a longer lifetime.

The present disclosure further provides an OLED display apparatus; and it includes the OLED device as described above, and may further include a thin-film transistor to control the OLED device to emit light.

Referring to FIGS. 2 and 3, the organic light-emitting diode may further include the electron injection layer between the cathode and the electron transport layer. Except for the first composite layer and the second composite layer additionally provided on two sides of the electron blocking layer, other layers of the organic light-emitting diode in the present disclosure may be configured in accordance with the related art, which is not limited herein.

Some embodiments of the present disclosure further provide an organic light-emitting diode display apparatus, including the organic light-emitting diode as described above.

The organic light-emitting diode display apparatus may be any other product or component having a display function, such as an organic light-emitting diode display panel, an organic light-emitting diode display module, a cell phone, and a wearable apparatus.

The foregoing embodiments mainly focused on the problem with blue OLEDs in the related art, and should there be similar problems in the selection of materials for OLEDs of other colors, the same idea also can be adopted to optimize these OLEDs.

However, the present disclosure is not limited to the foregoing embodiments, which are only provided for illustrating the concept behind the present disclosure, but are not intended to limit the present disclosure. Apparently, many modifications and variations are possible in light of the foregoing description. The embodiments herein were chosen and described to best explain the principles of the present disclosure and its practical application, and to thereby enable a person skilled in the art to best utilize the present disclosure and make modifications suitable for a particular use contemplated based on the present disclosure. The present disclosure is only limited by the claims, the complete scope of them and their equivalents.

The invention claimed is:

1. An organic light-emitting diode, comprising:
    an anode;
    a hole injection layer, comprising a hole injection material;
    a hole transport layer;
    an electron blocking layer;
    an organic luminescent layer, comprising a host material and a dopant material;
    a hole blocking layer;
    an electron transport layer; and
    a cathode,
    wherein a first composite layer is provided between the electron blocking layer and the organic luminescent layer, and the first composite layer comprises a material of the electron blocking layer and the host material of the organic luminescent layer;
    wherein a second composite layer is provided between the hole transport layer and the electron blocking layer, and the second composite layer comprises the material of the electron blocking layer and the hole injection material; and
    a content of the hole injection material in the second composite layer is higher than that in the hole injection layer.

2. The organic light-emitting diode according to claim 1, wherein
    the material of the electron blocking layer comprises a spirofluorene-based material or an aromatic amine-based material, and the host material of the organic luminescent layer comprises a naphthalene-based compound.

3. The organic light-emitting diode according to claim 2, wherein a mass ratio of the material of the electron blocking layer to the host material of the organic luminescent layer ranges from 2:8 to 8:2.

4. The organic light-emitting diode according to claim 3, wherein a thickness of the first composite layer ranges from 1 nm to 3 nm.

5. The organic light-emitting diode according to claim 1, wherein the material of the electron blocking layer comprises a spirofluorene-based material or an aromatic amine-based material, and the hole injection material comprises 2,3,5,6-tetrafluoro-7,7,8,8-tetracyanoquinodimethane, copper (II) phthalocyanine, polyaniline, or 4,4',4"-tris (N-3-methylphenyl-N-phenylamino) triphenylamine.

6. The organic light-emitting diode according to claim 5, wherein a mass percentage of the hole injection material in the second composite layer ranges from 4% to 10%.

7. The organic light-emitting diode according to claim 6, wherein a thickness of the second composite layer is between 1 nm and 3 nm.

8. The organic light-emitting diode according to claim 1, wherein
the electron transport layer comprises a first material comprising a quinoxaline or imidazole-based compound and a second material comprising aluminum octahydroxyquinoline;
a thickness of the electron transport layer ranges from 20 nm to 40 nm; and
a mass ratio of the first material to the second material ranges from 4:6 to 6:4.

9. The organic light-emitting diode according to claim 1, wherein the dopant material is a fluorene-based compound; and a mass percentage of the dopant material in the organic luminescent layer ranges from 1% to 5%.

10. The organic light-emitting diode according to claim 1, wherein the hole transport layer comprises an aromatic triamine-based compound; and
a thickness of the hole transport layer ranges from 80 nm to 130 nm.

11. A method of manufacturing an organic light-emitting diode, comprising:
forming an anode;
forming a hole injection layer such that the hole injection layer comprises a hole injection material;
forming a hole transport layer;
forming an electron blocking layer;
forming a first composite layer;
forming an organic luminescent layer such that the organic luminescent layer comprises a host material and a dopant material;
forming a hole blocking layer;
forming an electron transport layer; and
forming a cathode,
wherein the first composite layer comprises a material of the electron blocking layer and the host material of the organic luminescent layer;

wherein after the forming the hole transport layer and before the forming the electron blocking layer, the method further comprises forming a second composite layer on the hole transport layer such that the second composite layer comprises the material of the electron blocking layer and the hole injection material; and
a content of the hole injection material in the second composite layer is higher than that in the hole injection layer.

12. The method according to claim 11, wherein the forming the first composite layer comprises simultaneously evaporating the material of the electron blocking layer and the host material of the organic luminescent layer on the electron blocking layer.

13. The method according to claim 11, wherein
the material of the electron blocking layer comprises a spirofluorene-based material or an aromatic amine-based material, and the host material of the organic luminescent layer comprises a naphthalene-based compound;
a mass ratio of the material of the electron blocking layer to the host material of the organic luminescent layer ranges from 2:8 to 8:2; and
a thickness of the first composite layer ranges from 1 nm to 3 nm.

14. The method according to claim 11, wherein the forming the second composite layer on the hole transport layer comprises simultaneously evaporating the material of the electron blocking layer and the hole injection material on the hole transport layer.

15. The method according to claim 14, wherein the material of the electron blocking layer comprises an aromatic amine-based material, and the hole injection material comprises 2,3,5,6-tetrafluoro-7,7,8,8-tetracyanoquinodimethane, copper (II) phthalocyanine, polyaniline, or 4,4',4"-tris (N-3-methylphenyl-N-phenylamino) triphenylamine;
a mass percentage of the hole injection material in the second composite layer ranges from 4% to 10%; and
a thickness of the first composite layer ranges from 1 nm to 3 nm.

16. The method according to claim 11, wherein
the electron transport layer comprises a first material comprising a quinoxaline or imidazole-based compound and a second material comprising aluminum octahydroxyquinoline; and
the forming the electron transport layer comprises simultaneously evaporating the first material and the second material on the hole blocking layer.

17. The method according to claim 16, wherein
a mass ratio of the first material to the second material ranges from 4:6 to 6:4.

18. An organic light-emitting diode display apparatus, comprising the organic light-emitting diode according to claim 1.

* * * * *